(12) United States Patent
Kitagawa

(10) Patent No.: US 6,437,721 B1
(45) Date of Patent: Aug. 20, 2002

(54) SEMICONDUCTOR INTEGRATED CIRCUIT APPARATUS FOR PERFORMING DA/AD CONVERSION WITH HIGH ACCURACY USING A POTENTIAL DISTRIBUTION OF A STRING RESISTOR

(75) Inventor: Nobutaka Kitagawa, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/667,531

(22) Filed: Sep. 22, 2000

(30) Foreign Application Priority Data

Sep. 24, 1999 (JP) .......................................... 11-269913

(51) Int. Cl.⁷ .................................................. H03M 1/78
(52) U.S. Cl. ........................................ 341/154; 341/144
(58) Field of Search .................................. 341/154, 144, 341/145, 136, 138, 153, 156, 159

(56) References Cited

U.S. PATENT DOCUMENTS

| | | | |
|---|---|---|---|
| 5,617,091 A | * | 4/1997 | Uda ............................. 341/154 |
| 5,757,303 A | * | 5/1998 | Nakatani et al. ............. 341/159 |
| 6,037,889 A | * | 3/2000 | Knee ............................ 341/154 |
| 6,181,265 B1 | * | 1/2001 | Lee .............................. 341/145 |

FOREIGN PATENT DOCUMENTS

| | | |
|---|---|---|
| JP | 6-303137 | 10/1994 |
| JP | 9-64746 | 3/1997 |

* cited by examiner

Primary Examiner—Peguy JeanPierre
Assistant Examiner—Joseph Lauture
(74) Attorney, Agent, or Firm—Finnegan, Henderson, Farabow, Garrett & Dunner, L.L.P.

(57) ABSTRACT

A semiconductor integrated circuit apparatus has reference potential supplying pads to which reference potentials VREFH and VREFL are respectively supplied from an outside, a string resistor STRG with a plurality of taps, and reference potential wires formed between the pads and opposite ends of the string resistor STRG, respectively, where a resistance of a resistive element at one end of the string resistor is set in advance at a value lower than a resistance of resistive elements at an intermediate portion by a value corresponding to a wiring resistance parasitic on a reference potential wire, and another resistance of another resistive element at the other end of the string resistor is set in advance at a value lower than the resistance of the resistive elements at the intermediate portion by a value corresponding to another wiring resistance parasitic on another reference potential wire.

11 Claims, 7 Drawing Sheets

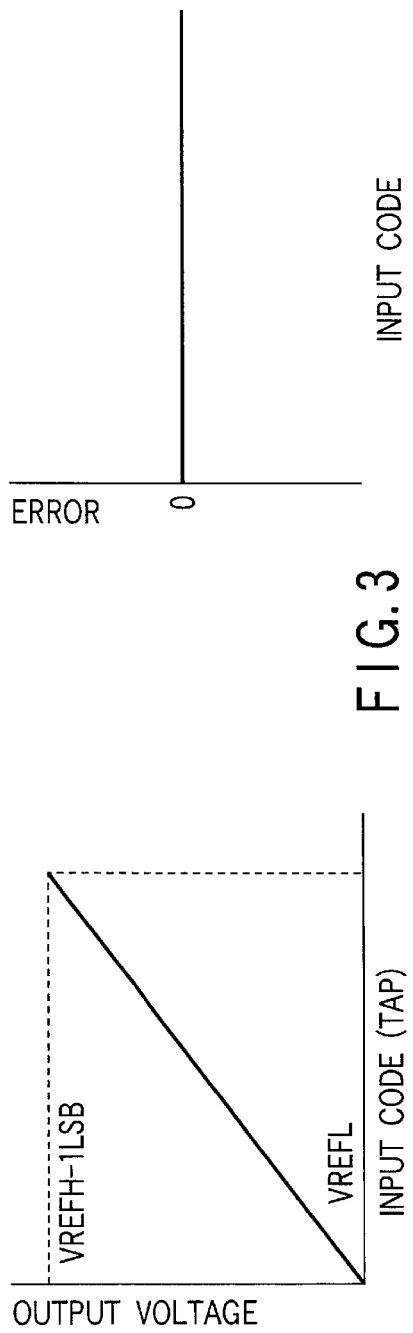
FIG. 2
FIG. 3
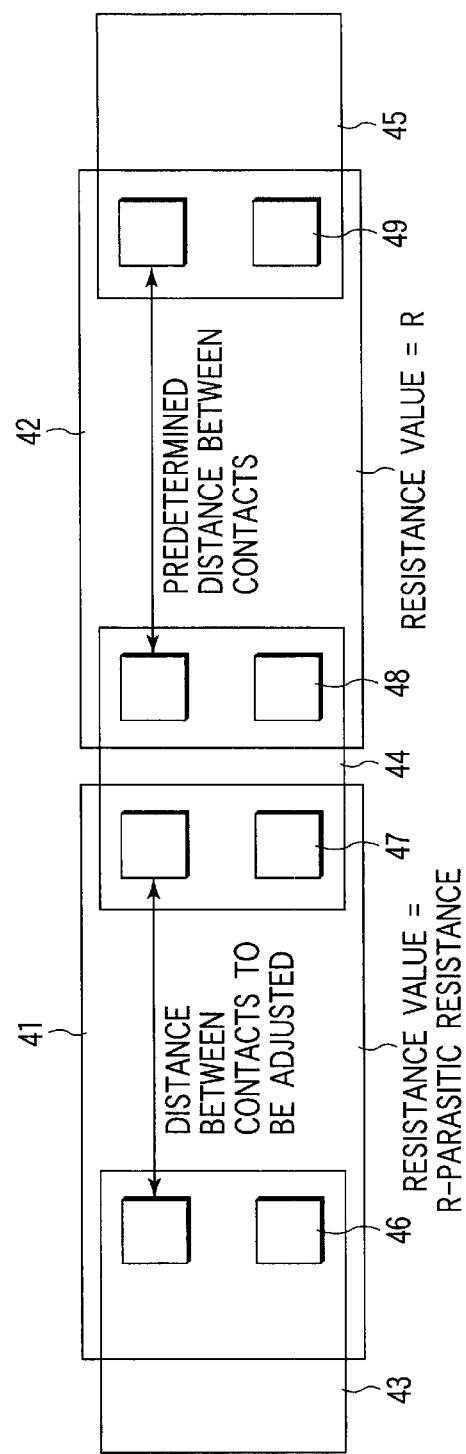
FIG. 4

SEMICONDUCTOR INTEGRATED CIRCUIT APPARATUS FOR PERFORMING DA/AD CONVERSION WITH HIGH ACCURACY USING A POTENTIAL DISTRIBUTION OF A STRING RESISTOR

CROSS-REFERENCE TO RELATED APPLICATIONS

This application is based upon and claims the benefit of priority from the prior Japanese Patent Application No. 11-269913, filed Sep. 24, 1999, the entire contents of which are incorporated herein by reference.

BACKGROUND OF THE INVENTION

The present invention relates to a semiconductor integrated circuit (IC) apparatus and, more particularly, to an IC apparatus provided with a built-in string resistor to be connected to a bonding pad. The present invention relates to, for example, a semiconductor integrated circuit apparatus for performing DA/AD conversion with high accuracy which is used in an analog mixed digital IC apparatus (microcomputer and the like) provided with built-in circuits such as a digital-analog (DA) conversion circuit and analog-digital (AD) conversion circuit as macrocells.

FIG. 9 is a circuit diagram illustrating an example of conventional DA conversion circuits formed inside an analog mixed digital IC apparatus.

In FIG. 9, a DA conversion macrocell 90 has a string resistor comprised of a plurality of resistive elements, connected in series, each with an equal resistance R, a set of switching elements of which the switching is controlled by a digital code input, and an operation amplification circuit A to which a selected output from the set of switching elements is input.

The string resistor is connected at its one end to a first bonding pad 91 to which a first reference potential VREFH is supplied from an outside, and further connected at its the other end to a second bonding pad 92 to which a second reference potential VREFL is supplied from an outside.

Each switching element SW contained in the set of switching elements is connected at its one end to either of one end, a voltage dividing node (tap), and the other end of the string resistor in the DA conversion macrocell 90. Each switching element SW is commonly connected at its the other end to a (+) input terminal of the operation amplification circuit A. An output terminal of the operation amplification circuit A is connected to a DA conversion output terminal 93, while being connected to a (−) input terminal thereof as feedback.

Generally a DA conversion output voltage VOUT of the above-mentioned DA conversion macrocell 90 is determined with an upper limit potential VREFH, lower limit potential VREFL, the number of bits of the digital code input and the contents (size) of the code input which are supplied from the outside as follows:

$$VOUT = VREFL + (VREFH - VREFL) \times \text{code input}/2^n$$

Assuming, for example, that n=12, VREFH=3V and VREFL=0V, the size of the code input is a value ranging from 0 to $(2^n - 1) = 4095$, and the VOUT has a value ranging from 0.0000V to 2.999267V. In this case, an analog voltage with a weight of 1LSB should be 0.732 mV.

In order to achieve the DA conversion with such high accuracy, it is necessary to prepare measures with respect to not only noises generated from a logic circuit in the IC apparatus but also a voltage drop caused by wiring resistances parasitic on various wires.

That is, in the IC apparatus, all the resistances in passes from a pin of a package to reference potential (VREFH and VREFL) applying nodes via lead frames, bonding wires, internal metal wiring and others cause a voltage drop by currents carried at bottoms, and thereby result in deterioration of DA conversion accuracy.

In particular, the parasitic resistance on the internal metal wiring tends to be grater than others, and to make the resistance low, it is necessary to design the internal metal wiring so that the resistance becomes extremely small. For that, it is considered to design the internal metal wiring with broad widths and short lengths. However, such a design causes increased chip sizes and increased cost, provides a limited condition in chip layout, and therefore becomes a factor very hard to handle.

For example to achieve the resolution under the conditions that VREFH=3 and n=12 bits, accuracy of 0.732 mV/1LSB is needed. When a resistance of the string resistor illustrated in FIG. 9 is assumed to be 10 kΩ, since 10 kΩ/4096=2.44 Ω corresponds to 1LSB, in order to suppress a conversion accuracy error to be equal to or less than LSB/2, it is necessary to suppress resistances RH and RL of wiring resistances respectively parasitic on reference potential wires 94 and 95 to be almost 1.2 Ω.

When a sheet resistance of aluminum wiring used as the internal metal wiring is 100 mΩ/sheet, the wiring resistance of 1.2 Ω requires twelve sheets. When the width of the aluminum wiring is 20 μm, the length thereof is 240 μm.

Meanwhile in order to achieve the wiring resistance as described above taking wiring inside a chip into consideration, it is required to bring the D/A conversion macrocell 90 very close to bonding pads 91 and 92, and to connect those with a shortest distance using metal wiring to shorten the metal wiring between the bonding pads 91 and 92 and DA conversion macrocell 90.

However, actualizing the wiring is difficult in which the D/A conversion macrocell 90 is arranged very close to the bonding pads 91 and 92 and the sheet resistance of the wiring is not more than an allowance, because of limitations in chip size, positions of bonding pad sections, position of the DA conversion macrocell 90 inside the IC apparatus and pattern layout including other digital circuit sections. In other words, there is a trade-off relationship between the pattern layout (cost) and an extent of deterioration of accuracy caused by the parasitic wiring resistance with equal to or more than the allowance.

FIG. 10 is a characteristic chart showing a potential distribution of the string resistor section in FIG. 9.

In the figure, a thick line shows a characteristic example when a sufficient decrease of a resistance of an internal wire is not achieved, and a thin line shows an ideal characteristic.

FIG. 11 is another characteristic chart showing an example of relationships between a code input (tap position) and conversion error in the DA conversion macrocell 90 in FIG. 9.

Accordingly, when the sufficient decrease of the resistance of the internal wire is not achieved as the conventional example as described above, as shown with the thick line in FIG. 10, the potential distribution of the string resistor section is not linear. Therefore a DA conversion output voltage VOUT is not. laid in an original range of VREFL to VREFH, shows a characteristic indicative of a reduced range, and thereby causes the deterioration of accuracy (change in errors) as shown in FIG. 11.

FIG. 12 is a block diagram illustrating a DA conversion circuit according to another conventional example.

In this DA conversion circuit, correction data to correct conversion errors are stored in advance, for example, in a correction data RAM 120. In outputting by DA conversion, the correction data is read with respect to the DA conversion output from an original DAC (DA converter) 121, and an output buffer circuit 123 performs a correction operation on an output subjected to DA conversion in correcting DAC 122, and outputs a corrected output VOUT.

This DA conversion circuit is effective in preventing the accuracy deterioration caused by a difference between a designed value and actual resistance of the string resistor in the DAC 121. However the DA conversion circuit has problems that a configuration of the circuit is complicated, and that another accuracy deterioration is not prevented which is caused by a voltage drop of the reference voltage due to the wiring resistance as described previously.

As described above, the conventional semiconductor integrated circuit apparatus has had the problem that the linearity of a potential distribution of a string resistor section deteriorates, which occurs when a wiring resistance is equal to or more than an allowance which is parasitic on a reference potential wire between a reference potential supplying pad and the string resistor section, and thereby the conversion accuracy deteriorates in DA conversion and AD conversion using the potential distribution of the string resistor section.

BRIEF SUMMARY OF THE INVENTION

The present invention is carried out to solve the above-mentioned problems. It is an object of the present invention to provide a semiconductor integrated circuit apparatus capable of ensuring linearity of a potential distribution of a string resistor section with a proportional characteristic maintained and with high accuracy even when a wiring resistance of a reference potential wire between a reference potential supplying pad section and the string resistor section is not less than an allowance, thereby enabling conversion with high accuracy in DA conversion and AD conversion using the potential distribution of the string resistor section.

A semiconductor integrated circuit apparatus according to the present invention has a first reference potential supplying pad to which a first reference potential is supplied from an outside, a string resistor having a first resistive element, a plurality of second resistive elements connected in series, a third resistive element, voltage taps each provided between adjacent two of those resistive elements, where one end of the first resistive element is connected to one end of the plurality of second resistive elements connected in series, and one end of the third resistive element is connected to the other end of the plurality of second resistive elements connected in series, a first reference potential wire which connects the first reference potential supplying pad and one end of the string resistor, a second reference potential supplying pad to which a second reference potential is supplied from an outside, and a second reference potential wire which connects the second reference potential supplying pad and the other end of the string resistor, where a resistance of the first resistive element is a value lower than a resistance of each of the second resistive elements by a wiring resistance parasitic on the first reference potential wire, and the resistance of the third resistive elements is a value lower than the resistance of each of the third resistive elements by a wiring resistance parasitic on the second reference potential wire.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a characteristic chart showing a potential distribution of a string resistor in FIG. 1;

FIG. 3 is a characteristic chart showing an example of relationships between a code input (tap position) and conversion error in the DA conversion circuit in FIG. 1;

FIG. 4 is a plane pattern view showing a specific example to set resistances of resistive elements positioned at opposite ends of the string resistor to be lower than resistances of resistive elements positioned at an intermediate portion of the string resistor in a DA conversion macrocell in FIG. 1;

DETAILED DESCRIPTION OF THE INVENTION

Embodiments of the present invention will be described below with reference to accompanying drawings.

An outline of the present invention is first explained with reference to FIG. 1.

Figure 1:
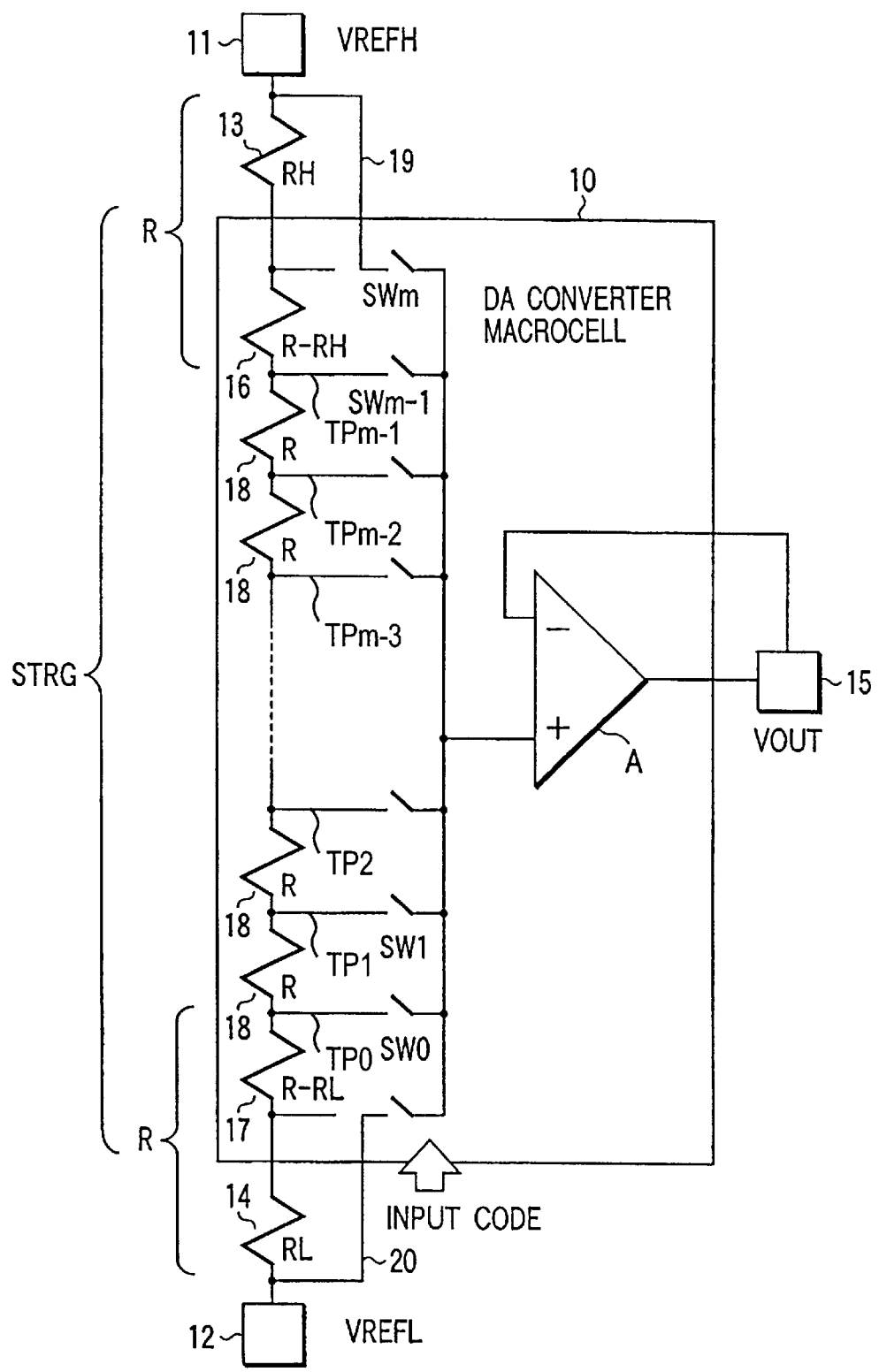
FIG. 1 is a circuit diagram illustrating a DA conversion circuit formed in an analog circuit mixed digital IC apparatus according to a first embodiment of the present invention.

A DA conversion circuit illustrated in FIG. 1 is provided with reference potential supplying pads 11 and 12 to which reference potentials VREFH and VREFL are respectively supplied from an outside, a string resistor STRG with a plurality of taps, reference potential wires 13 and 14 respectively between the reference potential supplying pads 11 and 12 and the string resistor STRG. The string resistor STRG is connected at its one end to the reference potential supplying pad 11, and further connected at its the other end to the reference potential supplying pad 12.

A resistance of a resistive element 16 at one end of the string resistor STRG is set in advance to be a value lower than the resistance of each of the resistive elements 18 at an intermediate portion of the string resistor STRG by a wiring resistance parasitic on the reference potential wire 13. Similarly, a resistance of a resistive element 17 at the other end of the string resistor STRG is set in advance to be a value lower the resistance of each of the resistive elements 18 at the intermediate portion of the string resistor STRG by a value corresponding to the wiring resistance parasitic on the reference potential wire 13. According to this constitution, it is possible to ensure the linearity of the potential distribution of the string resistor STRG with high accuracy and with a proportional characteristic maintained.

Further, there are provided a first switching element SWm for reference potential VREFH selector connected at its one end to the reference potential supplying pad 11 or in the vicinity thereof via a wire 19 different from the reference potential wire 13, a plurality of second switching elements SW1 to SWm-1 connected at respective one ends to corresponding taps of the string resistor STRG, and a third switching element SW0 for reference potential VREFL selector connected at its one end to the reference potential supplying pad 12 or in the vicinity thereof via a wire 20 different from the reference potential wire 14. The other end of each of switching elements SW0 to SWm is connected commonly, and the switching elements SW0 to SWm are selected by a code input (digital input).

Thus, the reference potentials VREFH and VREFL of the reference potential supplying pads 11 and 12 are directly supplied to the switching elements SWm and SW0 each for reference potential selector, respectively, not depending on wiring resistances of reference potential wires 13 and 14. It is thereby possible to perform conversion with high accuracy in DA conversion and AD conversion using the potential distribution of the string resistor STRG.

<First embodiment>

FIG. 1 illustrates a DA conversion circuit section formed in an analog circuit mixed digital IC apparatus according to the first embodiment of the present invention.

In FIG. 1, a DA conversion macrocell 10 has a string resistor STRG comprised of a plurality of resistive elements (for example, polysilicon resistors) connected in series, a set of switching elements SWm to SW0 of which the switching is controlled by a code input, and an operation amplification circuit A to which a selected output from the set of switching elements is input.

The string resistor STRG is connected at its one end to a first bonding pad 11, to which a first reference potential VREFH is supplied from an outside, via the reference potential wire 13. Similarly, the string resistor STRG is connected at its the other end to a second bonding pad 12, to which a second reference potential VREFL is supplied, via the reference potential wire 14.

Each switching element of the set of switching elements SWm to SW0 is connected at its one end to either of the first bonding pad 11, a voltage dividing node (tap) of the string resistor STRG in the DA conversion macrocell 10 and the second bonding pad 12, and is collectively connected at its the other end to a (+) input terminal of the operation amplification circuit A. An output terminal of the operation amplification circuit A is connected to a DA conversion output terminal 15, while being connected to a (−) input terminal thereof as feedback.

In this embodiment, each of the resistive elements 18 at an intermediate portion of the string resistor STRG has the same resistance (reference resistance) R. Resistive elements 16 and 17 at opposite ends of the string resistor STRG are formed to each have a resistance lower than the resistance R of the resistive elements 18 at the intermediate portion.

Herein when the resistance of the reference potential wire 13 connecting the bonding pad 11 (hereinafter referred to as "first bonding pad 11") to which the VREFH is supplied and one end of the string resistor STRG is assumed to be RH, the resistance of the resistive element 16 at one end at a side of VREFH in the string resistor STRG is set at R-RH.

Further when the resistance of the reference potential wire 14 connecting the bonding pad 12 (hereinafter referred to as "second bonding pad 12") to which the VREFL is supplied and the other end of the string resistor STRG is assumed to be RL, the resistance of the resistive element 17 at one end at a side of VREFL in the string resistor STRG is set at R-RL.

Accordingly a sum (series resistance) of the wiring resistance RH of the reference potential wire 13 and the resistance R-RH of the resistive element 16 at one end at the side of VREFH in the string resistor STRG is R, which is equal to the resistance R of the resistive elements 18 at the intermediate portion. Similarly, a sum (series resistance) of the wiring resistance RH of the reference potential wire 14 and the resistance R-RL of the resistive element 17 at the other end at the side of VREFL in the string resistor is R, which is equal to the resistance R of the resistive elements 18 at the intermediate portion.

Then each of the wire between the first bonding pad 11 and one end of the switching element SWm and the wire between the bonding pad 12 and one end of the switching element SW0 is to convey a potential, and wiring resistances thereof usually do not provide problems.

FIG. 2 is a characteristic chart showing the potential distribution of the string resistor in FIG. 1. FIG. 3 is a characteristic chart showing an example of relationships between a conversion error and code input (corresponding to a tap position) in the DA conversion circuit in FIG. 1.

In the DA conversion circuit configured as in FIG. 1, a DA conversion output voltage VOUT is defined with an upper limit potential VREFH, lower limit potential VREFL, the number of bits of the digital code input and the contents (size) of the code input which are supplied from an outside.

$$VOUT = VREFL + (VREFH - VREFL) \times code\ input/2^n$$

Assuming, for example, that n=12, VREFH=3V and VREFL=0V, the size of the code input is a value ranging from 0 to $(2^n-1)=4095$, the VOUT has a value ranging from 0.0000V to 2.999267V, and an analog voltage with a weight of 1LSB becomes 0.732 mV.

In this case, according to the DA conversion circuit configured as in FIG. 1, either of the VREFH, each tap voltage of the string resistor STRG, and VREFL is applied to one end of each of the switching elements SWm to SW0, and resistances between adjacent taps between the first bonding pad 11 and second bonding pad 12 all have an equal resistance R.

Accordingly as illustrated in FIG. 2, each tap voltage of the string resistor STRG is distributed linearly with high accuracy. Further as illustrated in FIG. 3, conversion errors become almost zero, and as a result, the conversion accuracy in the DA conversion circuit is improved.

Figure 10:
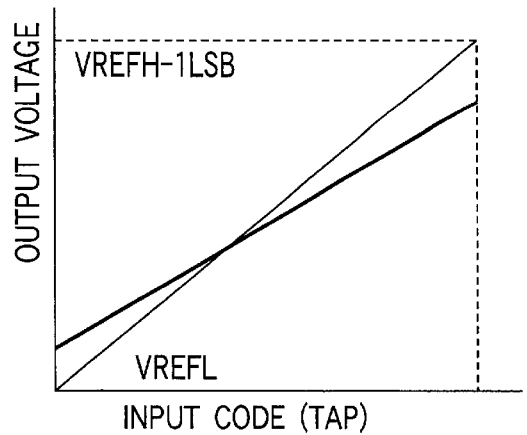
FIG. 10 is a characteristic chart showing a potential distribution of a string resistor in FIG. 9.
Figure 11:
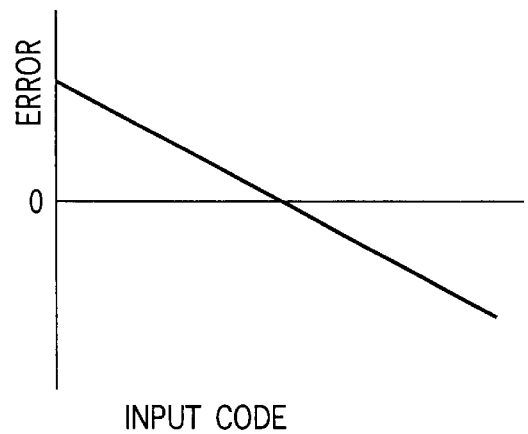
FIG. 11 is a characteristic chart showing an example of relationships between a code input (tap position) and conversion error in the DA conversion macrocell in FIG. 9.
Figure 12:
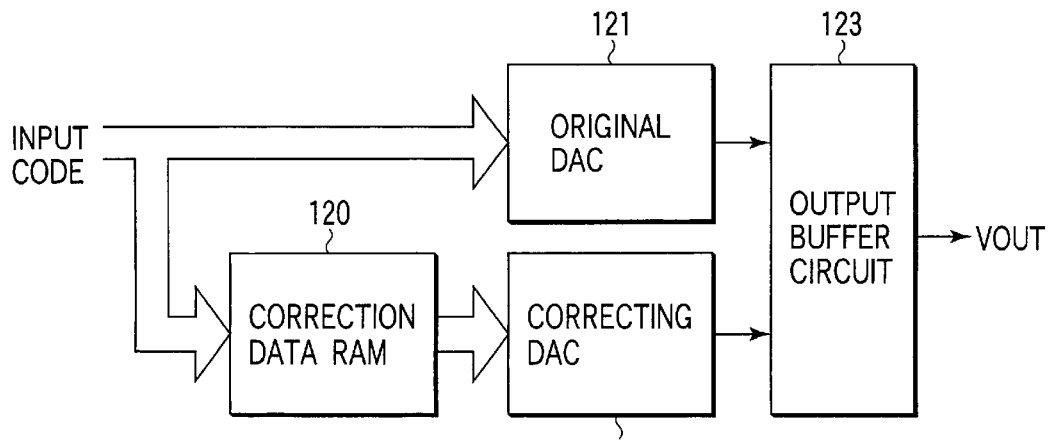
FIG. 12 is a block diagram of a DA conversion circuit according to another convention example.

FIG. 4 is an example of plane patterns to set respective resistances of the resistive elements 16 and 17 at opposite ends of the string resistor STRG in the DA conversion macrocell 10 in FIG. 10 to be a value lower than the resistance of the resistive elements 18 at the intermediate portion.

In FIG. 4, "41" denotes a first polysilicon resistive element (corresponding to the resistive element 16 or 17) at one end of the string resistor STRG, and "42" denotes a second polysilicon resistive element (corresponding to the resistive element 18) adjacent to the element 41.

"43" denotes an internal wire (metal wiring) to connect one end of the first polysilicon resistive element 41 and the boding pad 11, "44" denotes a first tap connecting wire (metal wiring) to connect the other end of the first polysilicon 41 and one end of the second polysilicon resistive element 42, and "45" denotes a second tap connecting wire (metal wiring) to connect the other end of the second polysilicon resistive element 42 and one end of a third polysilicon resistive element (not shown in the figure).

"46" denotes a contact section of the internal wire 43 and the first polysilicon resistive element 41, "47" denotes a contact section of the first tap connecting wire 44 and the first polysilicon resistive element 41, "48" denotes a contact section of the first tap connecting wire 44 and the second polysilicon resistive element 42, and "49" denotes a contact section of the second tap connecting wire 45 and the second polysilicon resistive element 42.

In this case, for example, by adjusting a contact position of the internal wire 43 with respect to the first polysilicon resistive element 41 at one end of the string resistor STRG, positions of contact sections 46, 47, 48 and 49 are set so that a distance L1 between two contact sections 46 and 47 with respect to the first polysilicon resistive element 41 at one end of the string resistor STRG is shorter than a distance L2 between two contact sections 48 and 49 with respect to the second polysilicon resistive element 42 at the intermediate portion of the string resistor STRG.

<Modification example in the first embodiment>

The above-described first embodiment may be modified as follows:

In the DA conversion macrocell 10 in FIG. 1, a switching element (for example, PMOS transistor) for reference current cutoff control may be provided, for example, at one end of a side of VREFH in the string resistor STRG. In this case, when a resistance of "ON" is set at Rp, a resistance of a resistive element at one end at the side of VREFH in the string resistor STRG is set at R-RH-Rp.

<Second embodiment>

In the above-described first embodiment, there is one resistive element at each of opposite ends of the string resistor STRG. In this embodiment, a plurality of resistive elements is arranged in parallel at least one of the opposite ends to be formed. It may be possible to use the plurality of resistive elements selectively. The second embodiment of the present invention applicable to such a case is explained below.

Figure 5:
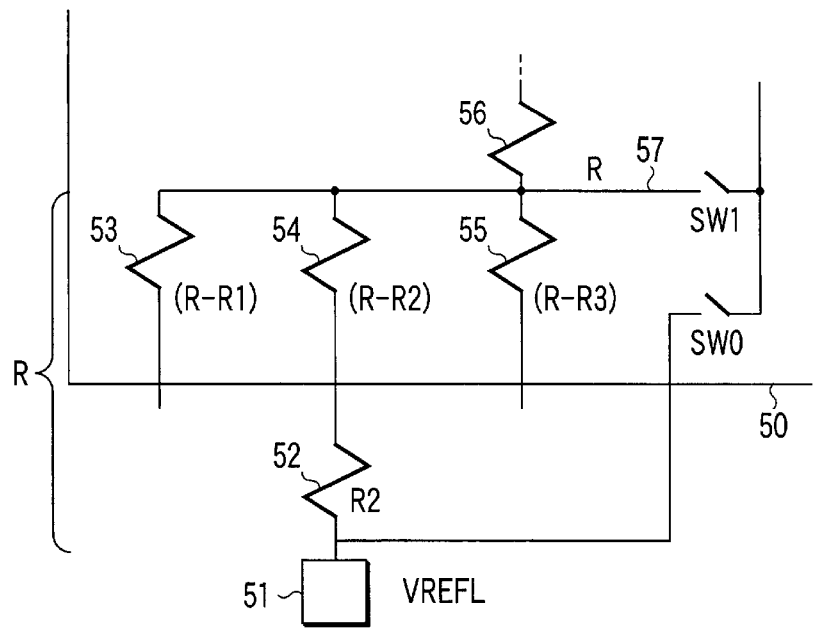
FIG. 5 is a circuit diagram illustrating part of a DA conversion circuit formed in an analog circuit mixed digital IC apparatus according to a second embodiment of the present invention.

FIG. 5 illustrates an example of part of a DA conversion circuit formed in an analog circuit mixed digital IC apparatus according to the second embodiment of the present invention.

In FIG. 5, resistive elements 53, 54 and 55 are provided at one end of a string resistor formed in a DA conversion macro 50. The resistive elements 53, 54 and 55 respectively have resistances (R-R1), (R-R2) and (R-R3). One ends of these resistive elements 53, 54 and 55 are commonly connected, and further connected to a tap 57. "51" denotes a VREFL supplying pad corresponding to one end of the string resistor STRG. R2 is a wiring resistance parasitic on a reference potential wire 52 between the pad 51 and one end of the string resistor STRG. The other configuration is the same as in the first embodiment.

In this embodiment, the wiring resistance R2 parasitic on the reference potential wire 52 between the pad 51 and one end of the string resistor STRG is assumed in advance, and corresponding to the wiring resistance R2, the resistive elements 53, 54 and 55 are formed so as to have a resistance lower than the reference resistance R.

SW0 and SW1 are switching elements composing part of a set of switching elements for code input. The switching element SW0 is connected at its one end to the pad 51. The switching element SW1 is connected at its one end to a voltage dividing tap 57 provided between the resistive elements 53, 54 and 55 at one end of the string resistor STRG and a resistive element 56.

In this embodiment, a resistive element with a resistance that is the closest to a resistance lower than the reference resistance R by the wiring resistance R2 actually parasitic on the reference potential wire 52 is selected among the plurality of resistive elements 53, 54 and 55, and the selected element is connected at its one end to the pad 51 by wiring. For example, in the example illustrated in FIG. 5, the wiring resistance is R2. A resistive element with the resistance that is the closest to the resistance (R-R2) lower than the reference resistance R by the wiring resistance R2 is the resistive element 54 (Resistance:R-R2), and therefore the resistive element 54 is selected, and connected to the wire 52.

<Third embodiment>

In the first embodiment previously mentioned, one resistive element is formed at each of opposite ends of the string resistor STRG. In this embodiment, a plurality of resistive elements are formed to be connected in series to at least one of the opposite ends, and at least one is selected from among the plurality of resistive elements to adjust a resistance. The third embodiment is explained below.

Figure 6:
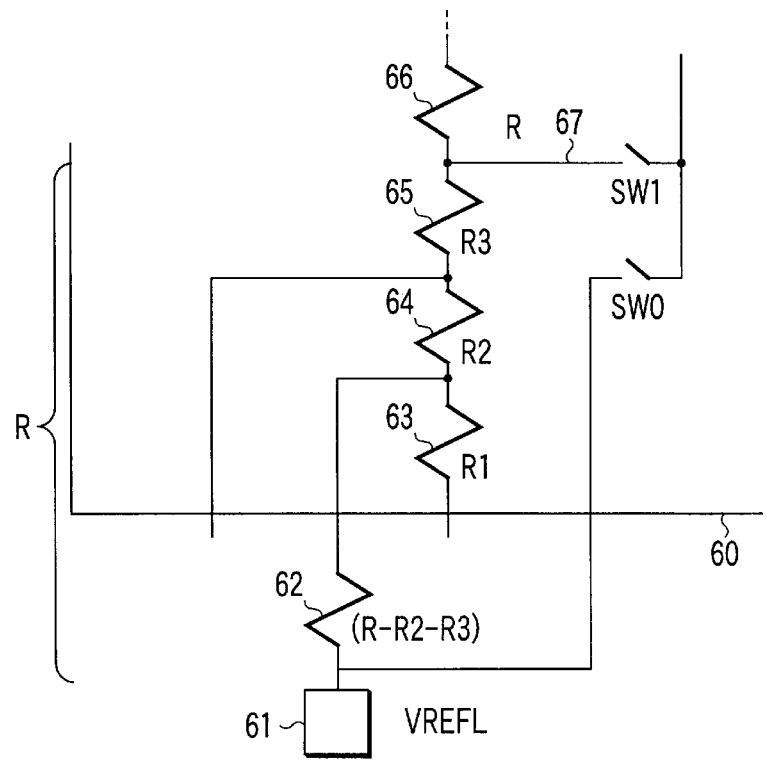
FIG. 6 is a circuit diagram illustrating an example of part of a DA conversion circuit formed in an analog circuit mixed digital IC apparatus according to a third embodiment of the present invention.

FIG. 6 illustrates an example of part of a DA conversion circuit section formed in an analog circuit mixed digital IC apparatus according to the third embodiment of the present invention.

In FIG. 6, resistive elements 63, 64 and 65 are formed as resistive elements at one end of a string resistor STRG formed in a DA conversion macro 60. Resistances of the resistive elements 63, 64 and 65 are assumed to be respectively R1, R2 and R3. These resistive elements are connected in series to be arranged. "61" denotes a VREFL supplying pad corresponding to one end of the string resistor STRG. (R-R2-R3) is a wiring resistance parasitic on a reference potential wire 62 between the pad 61 and one end of the string resistor STRG.

In this example, the wiring resistance (R-R2-R3) parasitic on the reference potential wire 62 is assumed in advance, and taps are formed between adjacent resistive elements so as to obtain a resistance (R2+R3) lower than the reference resistance R corresponding to the wire resistance (R-R2-3) using the plurality of resistive elements 63, 64 and 65.

SW0 and SW1 are switching elements composing part of a set of switching elements for code input. The switching element SW0 is connected at its one end to the pad 61. The switching element SW1 is connected at its one end to a voltage dividing tap 67 provided between the resistive element 65 and resistive element 66 adjacent to the element 65.

In this embodiment, a tap capable of obtaining a resistance that is the closest to the resistance (R2+R3) lower than the reference resistance R by the wiring resistance (R-R2-R3) actually parasitic on the reference potential wire 62 is selected among taps provided between adjacent two of the plurality of resistive elements 63, 64 and 65, connected in series, formed as resistive elements at one end of the string resistor STRG, and the selected tap is connected to the pad 62 by wiring.

<Modification examples in the first to third embodiments>

In each of the above first to third embodiments, resistances of resistive elements at opposite ends of a string resistor in a DA conversion macro are adjusted being adapted to expected wiring resistances actually parasitic on reference potential wires between pads and opposite ends of the string resistor, respectively.

In contrast to the foregoing, the reference potential wires are designed to adjust wiring resistances parasitic on the reference potential wires between the pads and the opposite ends of the string resistor, corresponding to resistances of the resistive elements at the opposite ends of the string resistor in the DA conversion macro. For example, a material and size of a wire are selected so as to obtain a desired wiring resistance. Such a design enables wiring design data for DA conversion macro to be used commonly between various IC apparatuses.

<Fourth embodiment>

Usually in the vicinity of a string resistive cell domain requiring high accuracy in a DA conversion macro, a dummy cell domain is provided to suppress fluctuations in production of the string resistive cell domain. A plurality of dummy cell resistors is formed in the dummy cell domain, and it may be possible to use the dummy cell resistors as resistive elements at opposite ends of the string resistor. The foregoing is explained below in the fourth embodiment.

Figure 7:
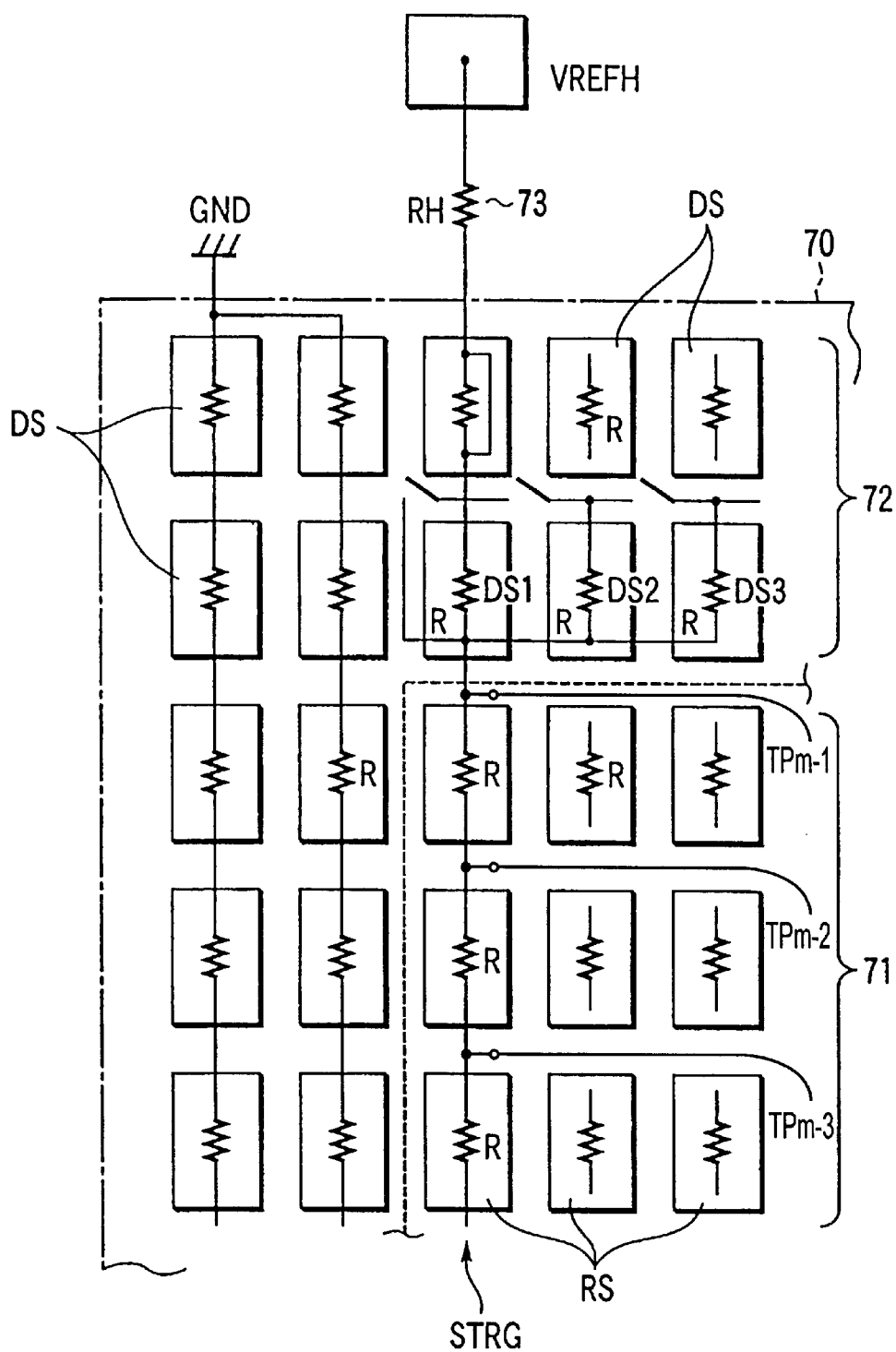
FIG. 7 is a circuit diagram illustrating an example of part of a DA conversion circuit formed in an analog circuit mixed digital IC apparatus according to a fifth embodiment of the present invention.

FIG. 7 illustrates an example of part of a DA conversion circuit section formed in an analog circuit mixed digital IC apparatus according to the fourth embodiment of the present invention.

In FIG. 7, "71" denotes a string resistive cell domain in a DA conversion macro 70, and "72" denotes a dummy cell domain. The string resistive cell domain 71 has a plurality of resistive cells RS, and the dummy cell domain 72 has a plurality of dummy cell resistors DS. Each of the resistive cells RS in the string resistive cell domain 71 and the dummy cell resistors DS in the dummy cell domain 72 has a resistance R. The plurality of resistive cells RS and that of dummy cell resistors DS are arranged in the form of a matrix.

At least part of the resistive cells RS in the string resistive cell domain 71 are used as resistive elements at an intermediate portion of the string resistor STRG (for example, resistive elements 18 illustrated in FIG. 1), and connected mutually.

Further part of the dummy cell resistors among dummy cell resistors DS in the dummy cell domain 72 is used as resistive elements at one end of the string resistor STRG. Unused dummy cell resistors left in the periphery are connected in series by metal wiring, and applied, for example, a ground potential GND.

(1) As an example, a case is considered that adjacent three of the dummy cell resistors DS on the same row in the dummy cell domain 72 are selectively used.

In this case, wiring is formed so as to commonly connect one ends of three dummy cell resistors DS1 to DS3. A reference potential wiring 73 is connected at a side of the other end of one dummy cell resistor DS1 as a reference (or in the case where another dummy cell is further present on extension of the other end, at a side of the other end of a short circuit of the another dummy cell).

Then one is selectively formed, with a master/slice method, from among metal wiring to connect another dummy cell resistor DS to one dummy cell resistor DS1 as a reference in parallel, another metal wiring to connect another two dummy cell resistors DS2 and DS3 to one dummy cell DS1 as a reference in parallel, and the other metal wiring to short-circuit one dummy cell DS1 as a reference.

In the case where as resistive elements at one end of the string resistor STRG, two dummy cell resistors DS1 and DS2 between the resistive elements at the intermediate portion of the string resistor STRG and the reference potential wire 73 are connected in parallel, since a combined resistance of these resistive elements becomes R/2, a resistance RH of the reference potential wire 73 is set at R/2.

Further in the case where as resistive elements at one ends of the string resistor STRG, three dummy cell resistors DS1 to DS3 are connected in parallel, since a combined resistance of these resistive elements becomes R/3, the resistance RH of the reference potential wire 73 is set at 2R/3.

Furthermore in the case where as a resistive element at one end of the string resistor STRG, one dummy cell resistor DS1 is short-circuited, since a resistance of this resistive element becomes 0, the resistance RH of the reference potential wire 73 is set at R.

(2) As another example, a case is considered that adjacent three of the dummy cell resistors on each of adjacent two rows, i.e., total six dummy cell resistors DS1 to DS6 (not shown in the figure) in the dummy cell domain 72 are selectively combined to be used.

In this case, wiring is formed so as to connect in series two dummy cell resistors on the same column, i.e., (DS1, DS2), (DS3, DS4) and (DS5, DS6), to connect commonly one ends of three sets of the dummy cell resistors connected in series, and to connect commonly the other ends thereof.

Thereby, since a resistance of the resistive elements at one end of the string resistor STRG (resistive elements between the resistive elements at the intermediate portion of the string resistor and the reference potential wiring 73) becomes 2R/3, the resistance of the reference potential wire 73 is set at R/3.

(3) As the other example, a case is considered that adjacent four of the dummy cell resistors on each of adjacent three rows, i.e., total twelve dummy cell resistors DS1 to DS12 (not shown in the figure) in the dummy cell domain 72 are selectively combined to be used.

In this case, wiring is formed so as to connect in series three dummy cell resistors on the same column, i.e., (DS1 to DS3), (DS4 to DS6), (DS7 to DS9), and (DS10 to DS12), to connect commonly one ends of four sets of the dummy cell resistors connected in series, and to connect commonly the other ends thereof.

Thereby, since a resistance of the resistive elements at one end of the string resistor STRG (resistive elements between the resistive elements at the intermediate portion of the string resistor and the reference potential wire 73) becomes 3R/4, the resistance of the reference potential wire 73 is set at R/4.

<Fifth embodiment>

In the above-mentioned fourth embodiment, a desired resistance is achieved for a resistive element at one end of the string resistor STRG by performing an arbitrary selection or combination of dummy cell resistors inside the DA conversion macro 70 to connect. This embodiment achieves the desired resistance for the resistive element at one end of the string resistor STRG by performing connection with metal wiring so that an arbitrary selection of dummy cell resistors is performed outside the DA conversion macro 70. The fifth embodiment is explained below.

Figure 8:
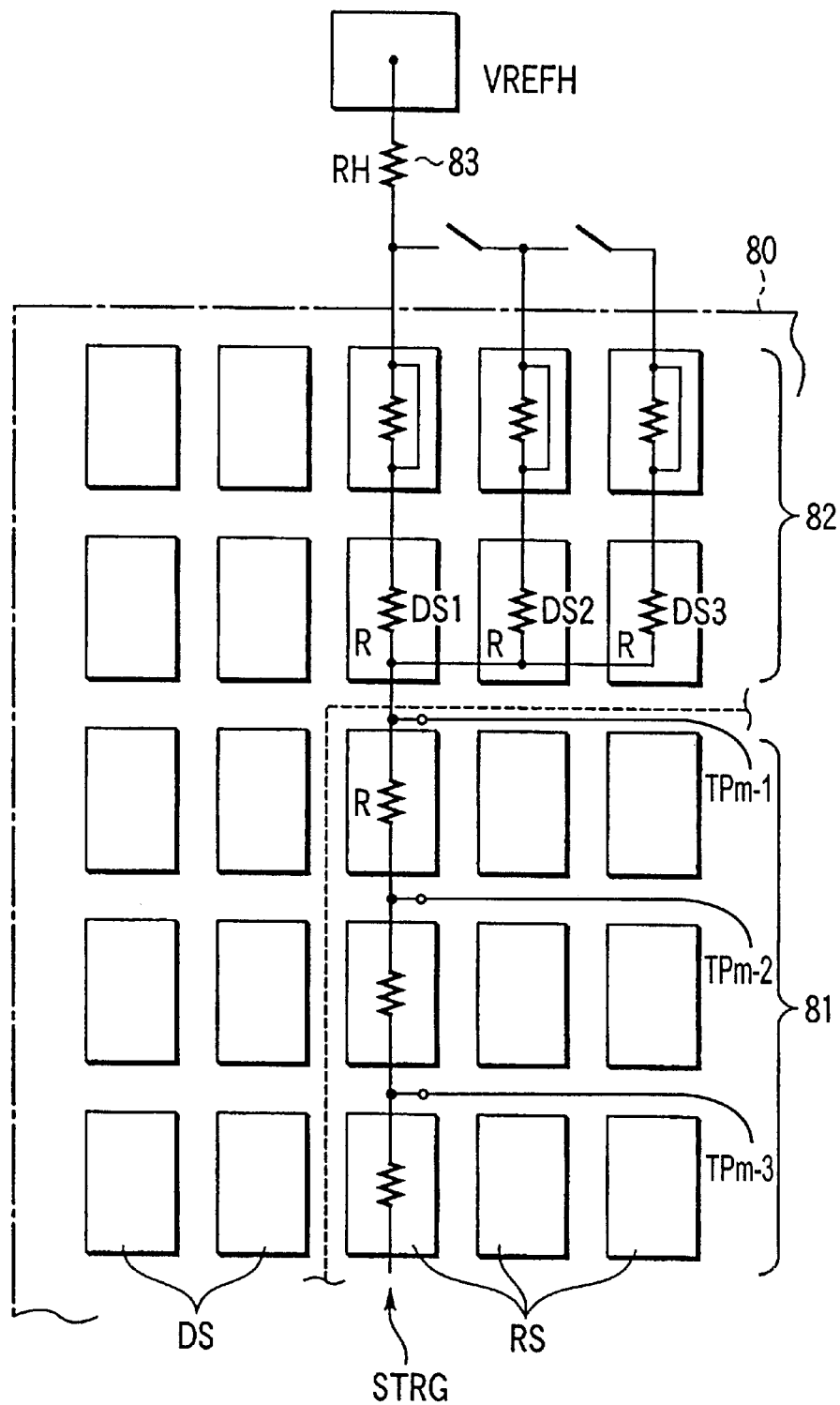
FIG. 8 is a circuit diagram illustrating an example of part of a DA conversion circuit formed in an analog circuit mixed digital IC apparatus according to a fifth embodiment of the present invention.
Figure 9:
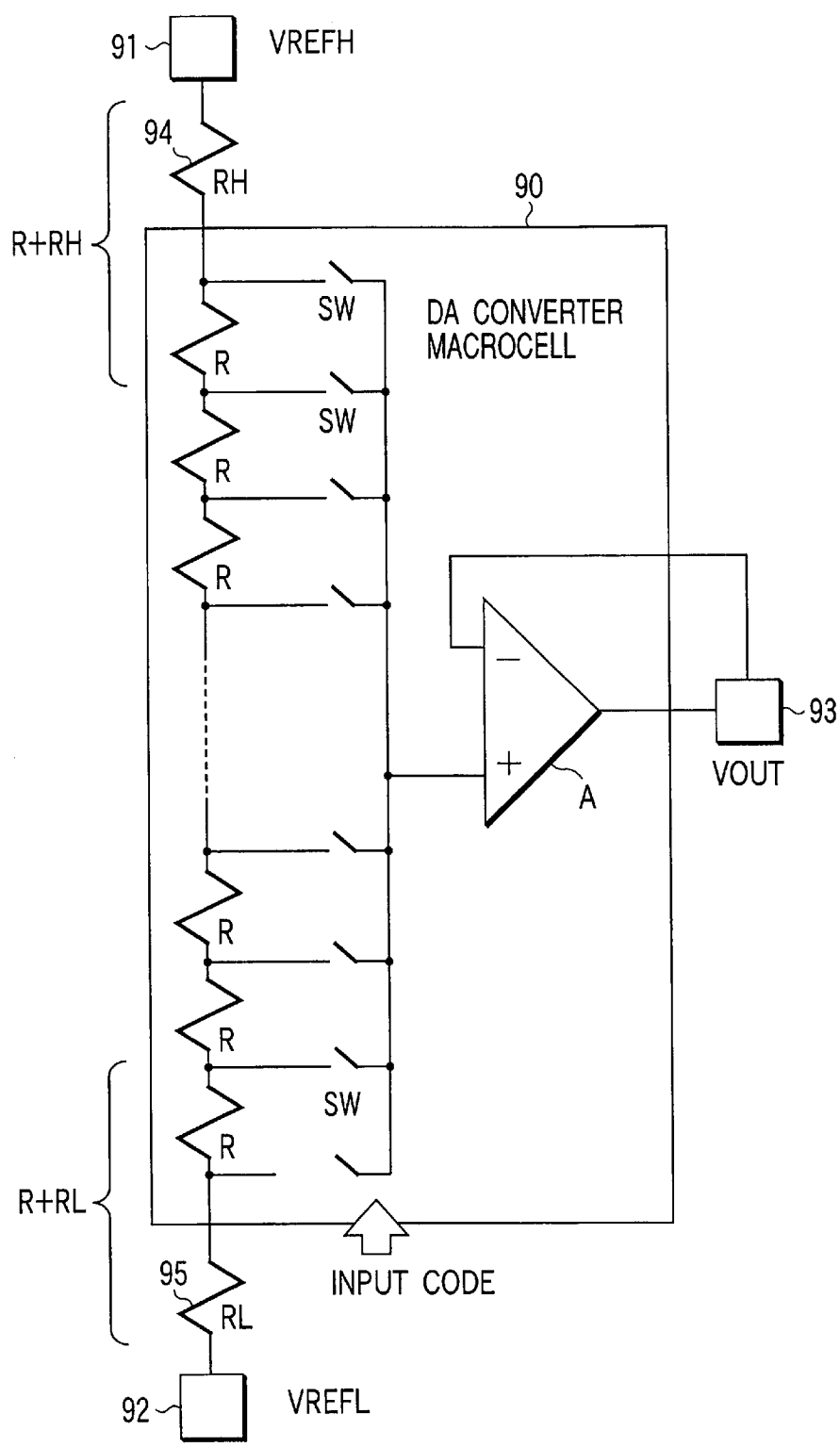
FIG. 9 is a circuit diagram illustrating an example of conventional DA conversion circuits formed in an analog circuit mixed digital IC apparatus.

FIG. 8 illustrates an example of part of a DA conversion circuit section formed in an analog circuit mixed digital IC apparatus according to the fifth embodiment of the present invention.

In FIG. 8, "81" and "82" denote respectively a string resistive cell domain and a dummy cell domain in a DA conversion macro 80. Each of resistive cells RS in the string resistive cell domain 81 and the dummy cell resistors DS in the dummy cell domain 82 has a reference resistance R, and is arranged in the form of a matrix as the entire.

At least part of the resistive cells RS in the string resistive cell domain 81 are used as resistive elements at an intermediate portion of the string resistor STRG, and connected mutually.

Further part of the dummy cell resistors among dummy cell resistors DS in the dummy cell domain 82 is used as resistive elements at one end of the string resistor STRG. Unused dummy cell resistors left in the periphery are connected in series by metal wiring, and applied, for example, a ground potential GND.

As an example, a case is considered that adjacent three dummy cell resistors DS1 to DS3 on the same row in the dummy cell domain 82 are selectively combined to be used.

In this case, wiring is formed so as to commonly connect one ends of the three dummy cell resistors DS1 to DS3, and a reference potential wiring 83 is connected at a side of the other end of one dummy cell resistor DS1 as a reference.

Then one is selectively formed outside the DA macro 80 from among metal wiring to connect another dummy cell resistor DS2 to one dummy cell resistor DS1 as a reference in parallel, and another metal wiring to connect another two dummy cell resistors DS2 and DS3 to one dummy cell DS1 as a reference in parallel.

In the case where as resistive elements at one end of the string resistor STRG, two dummy cell resistors DS1 and DS2 between the resistive elements at the intermediate portion of the string resistor STRG and the reference potential wire 83 are connected in parallel, since a combined resistance of these resistive elements becomes R/2, a resistance RH of the reference potential wire 83 is set at R/2.

Further in the case where as resistive elements at one end of the string resistor STRG, three dummy cell resistors DS1 to DS3 are connected in parallel, since a combined resistance of these resistive elements becomes R/3, the resistance RH of the reference metal wire 83 is set at 2R/3.

As described above, according to the present invention, it is possible to provide a semiconductor integrated circuit apparatus capable of ensuring linearity of a potential distribution of a string resistor section with a proportional characteristic maintained and with high accuracy even when a wiring resistance of a reference potential wire between a reference potential supplying pad and the string resistor becomes equal to or more than an allowance, thereby enabling conversion with high accuracy in DA conversion and AD conversion using the potential distribution of the string resistor section (for example, sequential comparison type AD conversion).

Moreover the circuit configuration is simple, thereby providing extremely high realizability, and is applicable to a preexisting DA conversion circuit apparatus and AD conversion circuit apparatus.

Further it is possible to employ a macrocell in different semiconductor chips by composing so that a resistance at one end of the string resistor is capable of being selected simply by changing wiring in the macrocell.

Furthermore it is possible to achieve a wiring resistance outside the macrocell with high accuracy only by an adjustment of a metal wiring layer corresponding to the resistance at one end of the string resistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit apparatus comprising:

a first reference potential supplying pad to which a first reference potential is applied;

a second reference potential supplying pad to which a second reference potential is applied;

a first reference potential wire having one end connected to the first reference potential supplying pad;

a second reference potential wire having one end connected to the second reference potential supplying pad; and a resistor string having a first resistive element with one end connected to a second end of the first reference potential wire, a series circuitry including a plurality of second resistive elements connected in series, the series circuitry having one end connected to a second end of the first resistive element, a third resistive element with one end connected to a second end of the series circuitry and the other end connected to the other end of the second reference potential wire, and voltage taps including a first voltage tap provided between the first reference potential supplying pad and the first reference potential wire, a second voltage tap provided between the first and second resistive elements, third voltage taps each provided between the second and third resistive elements, fourth voltage tap provided between the second reference potential supplying pad and the second reference potential wire, and a fifth voltage tap provided between the second reference potential supplying pad and the second reference potential wire; and wherein a sum of a parasitic resistance value of the first reference potential wire and a resistance value of the first resistive element corresponds to a resistance value of each of the second resistive elements, and a sum of a parasitic resistance value of the second reference potential wire and the resistance value of third resistive element corresponds to the resistance value of each of the second resistive elements.

2. A semiconductor integrated circuit apparatus according to claim 1, further comprising:

a first switching element connected at one end to the first voltage tap;

a second switching element connected at one end to the second voltage tap;

a plurality of third switching elements each connected at one end to corresponding one of the third voltage taps;

a fourth switching element connected at one end to the fourth voltage tap; and a fifth switching element connected at one end to the fifth voltage tap, wherein the first to the fifth switching elements each having a second end and wherein each of the second ends are connected in common at the other end to an output terminal and are turned on and off selectively in accordance with a digital input.

3. A semiconductor integrated circuit apparatus according to claim 1, wherein the first resistive element, the second resistive elements, and the third resistive element each comprise polysilicon resistance, and resistance values of the first resistive element, the second resistive elements, and the third resistive element are set at desired values respectively, by adjusting contact points of the first reference potential wire and the second reference potential wire with respect to the polysilicon resistance.

4. A semiconductor integrated circuit apparatus according to claim 1, wherein the resistor string is provided as a macrocell, and characteristic items of the first reference potential wire and the second reference potential wire are determined on the basis of the resistance values of the first resistive element and the third resistive element, respectively.

5. A semiconductor integrated circuit apparatus according to claim 4, wherein the characteristic items include at least one of material and dimension of the wire.

6. A semiconductor integrated circuit apparatus according to claim 1, wherein the resistor string is provided as a macrocell, and at least one of the first resistive element and the third resistive element is provided by using a resistive element having a resistance value most close to a desired resistance value, the resistive element being selected from a plurality of resistive elements each of which is capable of connecting a corresponding reference potential wire and an end of the second resistive elements connected in series.

7. A semiconductor integrated circuit apparatus according to claim 6, wherein the desired resistance value is a resistance value smaller than a reference resistance value by the parasitic resistance value on the corresponding reference potential wire.

8. A semiconductor integrated circuit apparatus according to claim 6, wherein the resistor string is provided as a macrocell, and at least one of the first resistive element and the third resistive element is provided by selecting at least one resistive element from a plurality of resistive elements connected in series, the plurality of resistive elements in series connecting a corresponding reference potential wire and an end of the second resistive elements connected in series.

9. A semiconductor integrated circuit apparatus according to claim 8, wherein the plurality of resistive elements connected in series having taps coupled to ends of them and coupled between adjacent resistive elements, the selection of the resistive element is conducted by connecting one of the taps to the corresponding reference potential wire.

10. A semiconductor integrated circuit apparatus according to claim 9, wherein a tap to be connected to the corresponding reference potential wire is determined such that the resultant resistance value of selected resistive elements is most close to a resistance value smaller than the resistance value of a second resistive element by the parasitic resistance value on the corresponding reference potential wire.

11. A semiconductor integrated circuit apparatus according to claim 1, wherein the resistor string is provided as part of a macrocell having a plurality of cell resistors, the macrocell has a dummy cell region which is provided around a region where the resistor string is located, and at least one of the first resistive element and the third resistive element is provided by using at least one cell resistor in the dummy cell region.

* * * * *